(12) United States Patent
Liu et al.

(10) Patent No.: US 11,572,767 B2
(45) Date of Patent: Feb. 7, 2023

(54) DYNAMIC DESIGN METHOD FOR PERSONALIZED DRILL BIT FOR COMPLEX DIFFICULT-TO-DRILL FORMATION

(71) Applicant: CHENGDU UNIVERSITY OF TECHNOLOGY, Chengdu (CN)

(72) Inventors: Qingyou Liu, Chengdu (CN); Haiyan Zhu, Chengdu (CN)

(73) Assignee: CHENGDU UNIVERSITY OF TECHNOLOGY, Chengdu (CN)

( * ) Notice: Subject to any disclaimer, the term of this patent is extended or adjusted under 35 U.S.C. 154(b) by 875 days.

(21) Appl. No.: 16/503,471

(22) Filed: Jul. 4, 2019

(65) Prior Publication Data

US 2020/0263522 A1   Aug. 20, 2020

(30) Foreign Application Priority Data

Feb. 19, 2019   (CN) .......................... 201910124488.1

(51) Int. Cl.
*E21B 10/43*   (2006.01)
*E21B 41/00*   (2006.01)
(Continued)

(52) U.S. Cl.
CPC .......... *E21B 41/0092* (2013.01); *E21B 10/43* (2013.01); *G06F 17/16* (2013.01); *G06F 30/17* (2020.01); *G06F 30/20* (2020.01)

(58) Field of Classification Search
CPC ...... E21B 10/43; E21B 10/00; E21B 2200/20; G06F 17/16; G06F 30/17; G06F 30/20
See application file for complete search history.

(56) References Cited

U.S. PATENT DOCUMENTS

2005/0209912 A1* 9/2005 Veeningen ....... G06Q 10/06312
705/7.12
2005/0273302 A1* 12/2005 Huang .................... E21B 10/00
703/10

FOREIGN PATENT DOCUMENTS

CN   101975025 A   2/2011
CN   102003144 A   4/2011
(Continued)

OTHER PUBLICATIONS

Cardu et al. Experimental Laboratory Tests Focus on Rock Characterisation for Mechanical Excavation International Journal of Mining, Reclamation and Environment, (Year: 2012).*

*Primary Examiner* — Rehana Perveen
*Assistant Examiner* — Cuong V Luu
(74) *Attorney, Agent, or Firm* — Bayramoglu Law Offices LLC

(57) ABSTRACT

A design method for a personalized drill bit for a complex difficult-to-drill formation includes: S1, acquiring rock drillability indexes of a drilled formation; S2, performing digital simulation analysis of rock breaking of bit teeth and a composite rock breaking experiment of a ring gear and a drill bit, and establishing a mechanical model of the rock interaction at the bottom of a well; S3, establishing an integrated dynamics model of drill string-drill bit-rock system coupling; S4, designing a tooth shape, a tooth distribution density, a crown shape and a gauge protection structure for rock mechanics properties of a complex difficult-to-drill formation; S5, optimizing bit nozzle and hydraulic structure parameters by using the computational fluid dynamics theory and the numerical simulation method; S6. optimizing a manufacturing process of the drill bit by using the tooth (Continued)

material decarburization strengthening technology, the high-strength bit body material technology and the special tooth-shaped tooth technology.

5 Claims, 1 Drawing Sheet

(51) Int. Cl.
  *G06F 30/20* (2020.01)
  *G06F 30/17* (2020.01)
  *G06F 17/16* (2006.01)

(56) References Cited

FOREIGN PATENT DOCUMENTS

| | | | | |
|---|---|---|---|---|
| CN | 104533299 A | * | 4/2015 | ............. E21B 10/46 |
| CN | 105178868 A | | 12/2015 | |
| CN | 208106331 U | * | 11/2018 | |
| CN | 109783930 A | * | 5/2019 | |

* cited by examiner

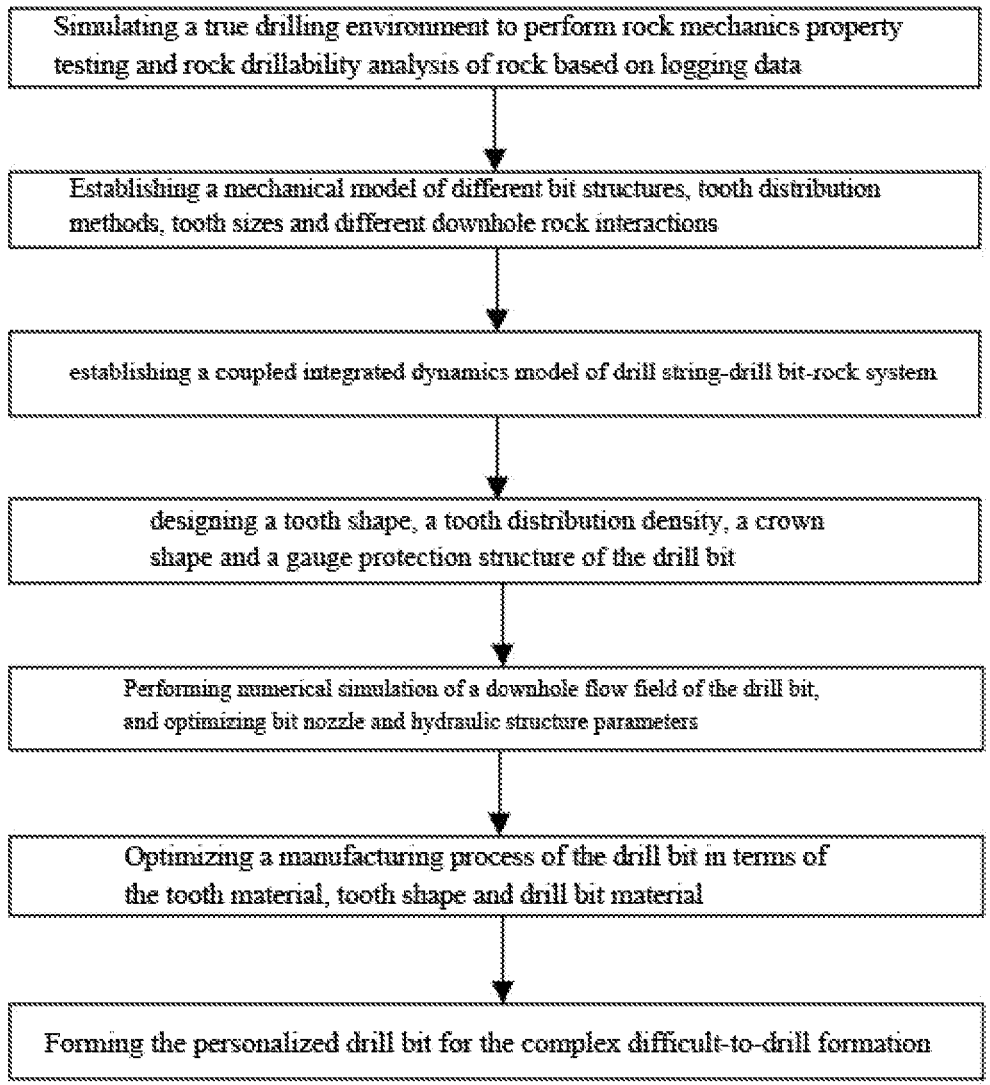

DYNAMIC DESIGN METHOD FOR PERSONALIZED DRILL BIT FOR COMPLEX DIFFICULT-TO-DRILL FORMATION

CROSS REFERENCE TO THE RELATED APPLICATIONS

This application is based upon and claims priority to Chinese Patent Application No. CN 201910124488.1, filed on Feb. 19, 2019, the entire contents of which are incorporated herein by reference.

TECHNICAL FIELD

The present invention relates to the technical field of oil and gas exploration and development, in particular to a dynamic design method for a personalized drill bit for a complex difficult-to-drill formation.

BACKGROUND

With the deepening of exploration and development of oil and gas fields, the focus of oil and gas development has gradually turned to oil and gas resources in deep formations. As a result, the stratigraphic structures encountered while drilling are becoming more and more complex, and drilling is becoming more and more difficult, including deep wells, ultra-deep wells, complex structural wells and the like. The deep oil and gas resources have complex burial conditions (including high temperature, high pressure, high sulfur content, low permeability and the like), and have the characteristics of deep burial, compact rock, large lithology change, poor drillability, high quartz content, high abrasiveness and the like. When a conventional drill bit drills in such a formation, the life of a single drill bit is low, accompanied with a small footage and an average mechanical drilling speed. Therefore, researches on the drill bit technology for complex difficult-to-drill formations can prolong the service life of such drills, reduce the drill bit development cost, and improve the drilling efficiency, thus enabling efficient development of oil-gas reservoirs of deep complex formations.

The patent CN201510484868.8 invented a design method and device of a PDC drill bit, and the PDC drill bit. In this patent, the average drilling speed, the downhole drilling speed of the drill bit and the number of drill bit blades are analyzed to obtain a height difference between front cutting teeth and rear cutting teeth of the drill bit. The patent CN201010500274.9 invented a fractal design method of diamond particle distribution of a diamond drill bit, and proposed a design method for the size, quantity and distribution of diamond particles of diamond drill bit. The patent CN201010500309.9 invented a fractal design method of a gear tooth structure of a roller bit, and proposed a design method for the size, quantity and distribution of the tooth of the cone bit. The above patents only study the design method of the drill bit from a single factor of drilling parameters, diamond particles and roller teeth, but neglect the influences of the vibration of a drill string and the changes in the rock properties of the formation on a working state of the drill bit. Therefore, it is difficult to make a big breakthrough in the performances of the designed drill bit.

Early drill bit design often uses "trial and error experience method", which only considers the influences of a drilling pressure on the static strength of the drill bit, that is, a single factor, without considering the influences of the vibration of the drill string and the change of lithology. Therefore, the designed drill bit is mainly used for shallow well and low drilling speed drilling. The drill bit drills forward by breaking rock at the bottom of the well, so the drilling speed and life of the drill bit are directly related to the performances of the rock at the bottom of the well; meanwhile, the drill bit implements drilling by means of a drill string that provides movement and power. The vibrations (including longitudinal, lateral and torsional vibration) of the drill string directly affect the use performances of the drill bit. Previously, it is assumed in the drill bit design that the rock is located at the bottom of a homogeneous flat well, without considering the influences of the structure of the drill bit, the shape of the teeth, the tooth distribution method and the formation rock (hardness, strength, Poisson's ratio, ground stress, etc.) on the drill bit design, and therefore, the personalized design requirements of the drill bit cannot be met. At present, there is little research on the design method of personalized drill bits for deep and complex difficult-to-drill formations.

SUMMARY

An objective of the present invention is to overcome the defects of the prior art, and provides a dynamic design method for a personalized drill bit for a complex difficult-to-drill formation.

The objective of the present invention is implemented by means of the following technical solution: a dynamic design method for a personalized drill bit for a complex difficult-to-drill formation comprises the following steps:

S1, simulating a high temperature and high pressure environment under the shaft, performing rock mechanics property testing and analysis on the complex difficult-to-drill formation, acquiring rock drillability indexes of the drilled formation, and meanwhile performing rock drillability analysis based on a debris microhardness experiment and logging data;

S2, performing digital simulation analysis of rock breaking of bit teeth and a composite rock breaking experiment of a ring gear and a drill bit, and establishing a mechanical model of different bit structures, tooth distribution methods, tooth sizes and different downhole rock interactions;

S3, discretizing a drill string into n unit by using a finite element method and an energy method, in consideration of the influences of the drill string structure, drill string vibration, well depth and hole diameter parameters on the bit-rock interaction, and establishing a coupled integrated dynamics model of drill string-drill bit-rock system by taking the drill bit as one unit at the bottommost end of the drill string;

S4, designing a tooth shape, a tooth distribution density, a crown shape and a gauge protection structure for rock mechanics properties of the complex difficult-to-drill formation according to impacting, scraping and gauge protection functions of teeth in different parts of the drill bit, by using teeth of different tooth shapes, i.e., a conical shape, a spherical shape and a wedged shape and non-uniform tooth distribution methods, i.e., unequally-spaced, twisted, and spiral tooth distribution methods;

S5, analyzing the flow field distribution of the drill bit under different drilling pressures, rotation speeds and mud flows by using the computational fluid dynamics theory and the numerical simulation method, and optimizing bit nozzle and hydraulic structure parameters;

S6, optimizing a manufacturing process of the drill bit by using the tooth material decarburization strengthening technology, the high-strength bit body material technology and the special tooth-shaped tooth technology;

S7, forming the personalized drill bit for the complex difficult-to-drill formation. Specifically, when the rock drillability analysis is performed based on the rock debris microhardness experiment in the step S1, the rock debris is collected in different well sections, the microhardness test is performed, and a drillable profile of the analyzed well section is established by using a relationship model of the rock drillability and the microhardness; the rock mechanics analysis of the whole well section and the difficulty of drilling are judged according to logging data, and the drillable profile of the whole well is established.

the mechanical model in the step S2 is as follows:

$$F_z(t) = \sum_{i,j,k} F^*_{vijk(t)}$$

$$F_{lx}(t) = \sum_{i,j,k} F^*_{lijk(t)} \cos(\pi + \alpha_{ijk(t)})$$

$$F_{ly}(t) = \sum_{i,j,k} F^*_{lijk(t)} \sin(\pi + \alpha_{ijk(t)})$$

$$M_R(t) = \sum_{i,j,k} l_{xijk(t)} f^*_{lxijk(t)} + \sum_{i,j,k} l_{yijk(t)} f^*_{lyijk(t)}$$

in which, $F_z(t)$ is a longitudinal reaction force of the rock received by the drill bit at any time, in a unit of N; $F^*_{vijk(t)}$ is the longitudinal reaction force received by the tooth of the drill bit at the time of reaching the bottom, in a unit of N; $F_{lx}(t)$ is the decomposition of a transverse force received by the drill bit at any time in an X direction, in a unit of N; $F_{ly}(t)$ is the decomposition of a transverse force received by the drill bit at any time in a Y direction, in a unit of N; $F^*_{lijk(t)}$ is a transverse force received by the tooth of the drill bit at the time of reaching the bottom, in a unit of N; $\alpha_{ijk(t)}$ is a working angle of the tooth of the drill bit at the time of reaching the bottom, in a unit of (°); $M_R(t)$ is a torsional time of the drill bit interacting with the rock at any time, in a unit of N·m; $f^*_{lxijk(t)}$ is the decomposition of a transverse force received by the tooth of the drill bit at any time of reaching the bottom in a X direction, in a unit of N; $f^*_{lyijk(t)}$ is the decomposition of a transverse force received by the tooth of the drill bit at any time of reaching the bottom in a Y direction, in a unit of N; $l_{xijk(t)}$ is a distance between the tooth of the drill bit at the time of reaching the bottom and the X axis, in a unit of m; $l_{yijk(t)}$ is a distance between the tooth of the drill bit at the time of reaching the bottom and the Y axis, in a unit of m.

Specifically, the coupled integrated dynamics model of drill string-drill bit-rock system in the step S3 is as follows:

$$M^e U^{e''} + C^e U^{e'} + K_L^e U^e + K_N^e U^e = F^e$$

$$M^e = \begin{bmatrix} M^e_{11(6\times 6)} & M^e_{12(6\times 6)} \\ M^e_{21(6\times 6)} & M^e_{22(6\times 6)} \end{bmatrix}$$

$$C^e = C_D^e + C_N^e$$

$$K^e = K_L^e + K_N^e$$

$$F^e = [f^e_{1(1\times 6)} \quad f^e_{2(1\times 6)}]$$

After assembling a unit model, an integrated dynamic model of the system is obtained: MU"+CU'+KU=F, in which, $M^e$ is a unit mass matrix; $C^e$ is a unit damping matrix; $C_D^e$ is a unit dissipative damping matrix; $C_N^e$ is a unit non-dissipative property damping matrix; $K^e$ is a unit stiffness matrix; $K_L^e$ is a linear part of the stiffness matrix; $K_N^e$ is a non-linear part of the stiffness matrix; $F^e$ is a unit load array; $U^{e''}$ acceleration array; $U^{e'}$ is a unit speed array; $U^e$ is a unit displacement array; M is an integrated mass matrix; C is an integrated damping matrix; K is an integrated stiffness matrix; F is an integrated load array; U" is an acceleration array of the system; U' is a speed array of the system; U is a displacement array of the system.

Specifically, the rock drillability indexes in the step S1 include rock hardness, strength, Poisson's ratio, and ground stress.

The present invention has the following advantages: 1, the present invention can deeply conduct the test and analysis of the drillability of the rock with respect to the characteristics of the complex difficult-to-drill formation, can more comprehensively grasp the true property parameters of the rock under the drilled formation, provide the preliminary technical support for the drill bit design, and overcome the problem of assuming a homogenized flat bottom of the well before the drill bit design;

2. the present invention establishes a coupled dynamics model of the drill string-drill bit-rock system, which can realistically simulate the influence of the vibration of the drill string on the interaction between the drill bit and the rock, and establish a new dynamic design method of the drill bit based on actual drilling conditions to realize breakthroughs in bit design from single factor to multiple factors, and from static to dynamic, thereby improving the reliability and feasibility of the drill bit design;

3. teeth of different tooth shapes, i.e., a conical shape, a spherical shape and a wedged shape and non-uniform tooth distribution methods, i.e., unequally-spaced, twisted, and spiral tooth distribution methods are adopted to perform the tooth shape, tooth distribution density and gauge protection structure design, thereby improving the ability of the teeth to invade the rock and the rock breaking efficiency of the drill bit;

4. the present invention conducts researches on the manufacturing technology of the drill bit, and realizes the design and manufacture of the personalized drill bit for the complex difficult-to-drill formation from the aspects of tooth material, tooth size, tooth shape and crown shape.

BRIEF DESCRIPTION OF THE DRAWINGS

FIG. 1 is a schematic diagram of a design flow of the present invention.

DETAILED DESCRIPTION OF EMBODIMENTS

The present invention will be further described below with reference to the accompanying drawings, but the protection scope of the present invention is not limited to the followings. As shown in FIG. 1, a dynamic design method for a personalized drill bit for a complex difficult-to-drill formation comprises the following steps:

S1, simulating a high temperature and high pressure environment under the shaft, performing rock mechanics property testing and analysis on the complex difficult-to-drill formation, acquiring rock drillability indexes of the drilled formation, and meanwhile performing rock drillability analysis based on a debris microhardness experiment and logging data;

S2, performing digital simulation analysis of rock breaking of bit teeth and a composite rock breaking experiment of a ring gear and a drill bit, and establishing a mechanical model of different bit structures, tooth distribution methods, tooth sizes and different downhole rock interactions;

S3, discretizing a drill string into n unit by using a finite element method and an energy method, in consideration of the influences of the drill string structure, drill string vibration, well depth and hole diameter parameters on the bit-rock interaction, and establishing a coupled integrated dynamics model of drill string-drill bit-rock system by taking the drill bit as one unit at the bottommost end of the drill string;

S4, designing a tooth shape, a tooth distribution density, a crown shape and a gauge protection structure for rock mechanics properties of the complex difficult-to-drill formation according to impacting, scraping and gauge protection functions of teeth in different parts of the drill bit, by using teeth of different tooth shapes, i.e., a conical shape, a spherical shape and a wedged shape and non-uniform tooth distribution methods, i.e., unequally-spaced, twisted, and spiral tooth distribution methods;

S5, analyzing the flow field distribution of the drill bit under different drilling pressures, rotation speeds and mud flows by using the computational fluid dynamics theory and the numerical simulation method, and optimizing bit nozzle and hydraulic structure parameters;

S6, optimizing a manufacturing process of the drill bit by using the tooth material decarburization strengthening technology, the high-strength bit body material technology and the special tooth-shaped tooth technology;

S7, forming the personalized drill bit for the complex difficult-to-drill formation.

Further, when the rock drillability analysis is performed based on the rock debris microhardness experiment in the step S1, the rock debris is collected in different well sections, the microhardness test is performed, and a drillable profile of the analyzed well section is established by using a relationship model of the rock drillability and the microhardness; the rock mechanics analysis of the whole well section and the difficulty of drilling are judged according to logging data, and the drillable profile of the whole well is established.

Further, the mechanical model in the step S2 is as follows:

$$F_z(t) = \sum_{i,j,k} F^*_{vijk(t)}$$

$$F_{lx}(t) = \sum_{i,j,k} F^*_{lijk(t)} \cos(\pi + \alpha_{ijk(t)})$$

$$F_{ly}(t) = \sum_{i,j,k} F^*_{lijk(t)} \sin(\pi + \alpha_{ijk(t)})$$

$$M_R(t) = \sum_{i,j,k} l_{xijk(t)} f^*_{lxijk(t)} + \sum_{i,j,k} l_{yijk(t)} f^*_{lyijk(t)}$$

in which, $F_z(t)$ is a longitudinal reaction force of the rock received by the drill bit at any time, in a unit of N; $F^*_{vijk(t)}$ is the longitudinal reaction force received by the tooth of the drill bit at the time of reaching the bottom, in a unit of N; $F_{lx}(t)$ is the decomposition of a transverse force received by the drill bit at any time in an X direction, in a unit of N; $F_{ly}(t)$ is the decomposition of a transverse force received by the drill bit at any time in a Y direction, in a unit of N; $F^*_{lijk(t)}$ is a transverse force received by the tooth of the drill bit at the time of reaching the bottom, in a unit of N; $\alpha_{ijk(t)}$ is a working angle of the tooth of the drill bit at the time of reaching the bottom, in a unit of (°); $M_R(t)$ torsional time of the drill bit interacting with the rock at any time, in a unit of N·m; $f^*_{lxijk(t)}$ is the decomposition of a transverse force received by the tooth of the drill bit at any time of reaching the bottom in a X direction, in a unit of N; $f^*_{lyijk(t)}$ is the decomposition of a transverse force received by the tooth of the drill bit at any time of reaching the bottom in a Y direction, in a unit of N; $l_{xijk(t)}$ is a distance between the tooth of the drill bit at the time of reaching the bottom and the X axis, in a unit of m; $l_{yijk(t)}$ is a distance between the tooth of the drill bit at the time of reaching the bottom and the Y axis, in a unit of m.

Further, the coupled integrated dynamics model of drill string-drill bit-rock system is as follows:

$$M^e U^{e''} + C^e U^{e'} + K_L^e U^e + K_N^e U^e = F^e$$

$$M^e = \begin{bmatrix} M^e_{11(6\times6)} & M^e_{12(6\times6)} \\ M^e_{21(6\times6)} & M^e_{22(6\times6)} \end{bmatrix}$$

$$C^e = C_D^e + C_N^e$$

$$K^e = K_L^e + K_N^e$$

$$F^e = [\, f^e_{1(1\times6)} \quad f^e_{2(1\times6)} \,]$$

After assembling a unit model, an integrated dynamic model of the system is obtained: MU"+CU'+KU=F, in which, $M^e$ is a unit mass matrix; $C^e$ is a unit damping matrix; $C_D^e$ is a unit dissipative damping matrix; $C_N^e$ is a unit non-dissipative property damping matrix; $K^e$ is a unit stiffness matrix; $K_L^e$ is a linear part of the stiffness matrix; $K_N^e$ is a non-linear part of the stiffness matrix; $F^e$ is a unit load array; $U^{e''}$ is a unit acceleration array; $U^{e'}$ is a unit speed array; $U^e$ is a unit displacement array; M is an integrated mass matrix; C is an integrated damping matrix; K is an integrated stiffness matrix; F is an integrated load array; U" is an acceleration array of the system; U' is a speed array of the system; U is a displacement array of the system.

The above content is only a preferred embodiment of the present invention and is not intended to limit the present invention in any way. Any person skilled in the art can make many possible variations and modifications to the technical solutions of the present invention by using the above-mentioned technical contents, or modify the technical solutions as equivalent embodiments of equivalent changes without departing from the scope of the technical solutions of the present invention. Therefore, any modifications, equivalent changes, and modifications made to the above embodiments in accordance with the techniques of the present invention are within the protection scope of the present technical solutions.

What is claimed is:

1. A dynamic design method for a personalized drill bit for a complex difficult-to-drill formation, comprising the following steps:

S1, simulating a high temperature and high pressure environment under a well, performing a rock mechanics property test and analysis on the complex difficult-to-drill formation, acquiring rock drillability indexes of a drilled formation, and performing a rock drillability analysis based on a rock debris microhardness experiment and logging data;

S2, performing a digital simulation analysis of rock breaking of bit teeth by conducting a composite rock breaking experiment for a ring gear and a drill bit, and establishing a mechanical model of different bit structures, non-uniform tooth distribution methods, tooth sizes, and different downhole rock interactions;

S3, discretizing a drill string into a unit by using a finite element method and an energy method, in consideration of influences of parameters of a drill string structure, a drill string vibration, a well depth, and a hole diameter on a bit-rock interaction, and establishing a coupled integrated dynamics model of a drill string-drill bit-rock system by taking the drill bit as one unit at a bottommost end of the drill string;

S4, designing a tooth shape, a tooth distribution density, a crown shape, and a gauge protection structure based on different shapes of the bit teeth and the non-uniform tooth distribution methods for impacting, scraping, and gauge protection functions of different parts of the bit teeth, wherein the different tooth shapes include a conical shape, a spherical shape, and a wedged shape, and the non-uniform tooth distribution methods include an unequally-spaced distribution method, a twisted distribution method, and a spiral tooth distribution method;

S5, analyzing a flow field distribution of the drill bit under different drilling pressures, rotation speeds, and mud flows by using a computational fluid dynamics theory and a numerical simulation method, and optimizing parameters of a bit nozzle and a hydraulic structure;

S6, forming the personalized drill bit by optimizing a manufacturing process of the drill bit by using a tooth material decarburization strengthening technology, a high-strength bit body material technology, and a special tooth-shaped tooth technology based on the rock drillability analysis in S1, the mechanical model in S2, the coupled integrated dynamics model in S3, the tooth shape, the tooth distribution density, the crown shape, and the gauge protection structure in S4, and the parameters of the bit nozzle and the hydraulic structure in S5.

2. The dynamic design method for the personalized drill bit for the complex difficult-to-drill formation according to claim 1, wherein when the rock drillability analysis is performed based on the rock debris microhardness experiment in the step S1, rock debris is collected in different well sections, a microhardness test is performed, and a drillable profile of an analyzed well section is established by using a relationship model of the a rock drillability and the microhardness; the rock mechanics analysis of a whole well section and a difficulty of drilling are judged according to the logging data, and the drillable profile of a whole well is established.

3. The dynamic design method for the personalized drill bit for the complex difficult-to-drill formation according to claim 1, wherein the mechanical model in the step S2 is as follows:

$$F_z(t) = \sum_{i,j,k} F^*_{vijk(t)}$$

$$F_{lx}(t) = \sum_{i,j,k} F^*_{lijk(t)}\cos(\pi + \alpha_{ijk(t)})$$

$$F_{ly}(t) = \sum_{i,j,k} F^*_{lijk(t)}\sin(\pi + \alpha_{ijk(t)})$$

$$M_R(t) = \sum_{i,j,k} l_{xijk(t)} f^*_{lxijk(t)} + \sum_{i,j,k} l_{yijk(t)} f^*_{lyijk(t)}$$

where $F_z(t)$ is a longitudinal reaction force of the rock received by the drill bit at any time, in a unit of N; $F^*_{vijk(t)}$ is a longitudinal reaction force received by the bit teeth of the drill bit at the time of reaching a bottom, in a unit of N; $F_{lx}(t)$ is a decomposition of a transverse force received by the drill bit at any time in an X direction, in a unit of N; $F_{ly}(t)$ is a decomposition of a transverse force received by the drill bit at any time in a Y direction, in a unit of N; $F^*_{lijk(t)}$ is a transverse force received by the bit teeth of the drill bit at the time of reaching the bottom, in a unit of N; $\alpha_{ijk(t)}$ is a working angle of the bit teeth of the drill bit at the time of reaching the bottom, in a unit of degree; $M_R(t)$ is a torsional time of the drill bit interacting with the rock at any time, in a unit of N·m; $f^*_{lxijk(t)}$ is a decomposition of a transverse force received by the bit teeth of the drill bit at any time of reaching the bottom in the X direction, in a unit of N; $f^*_{lyijk(t)}$ is a decomposition of a transverse force received by the bit teeth of the drill bit at any time of reaching the bottom in the Y direction, in a unit of N; $l_{xijk(t)}$ is a distance between the bit teeth of the drill bit at the time of reaching the bottom and the X direction, in a unit of m; $l_{yijk(t)}$ is a distance between the bit teeth of the drill bit at the time of reaching the bottom and the Y direction, in a unit of m.

4. The dynamic design method for the personalized drill bit for the complex difficult-to-drill formation according to claim 1, wherein the coupled integrated dynamics model of the drill string-drill bit-rock system in the step S3 is as follows:

$$M^e U^{e''} + C^e U^{e'} + K_L^e U^e + K_N^e U^e = F^e$$

$$C^e = C_D^e + C_N^e$$

$$K^e = K_L^e + K_N^e$$

After assembling a unit model, an integrated dynamic model of the drill string-drill bit-rock system is: MU"+CU'+KU=F, where, $M^e$ is a unit mass matrix; $C^e$ is a unit damping matrix; $C_D^e$ is a unit dissipative damping matrix; $C_N^e$ is a unit non-dissipative property damping matrix; $K^e$ is a unit stiffness matrix; $K_L^e$ is a linear part of the unit stiffness matrix; $K_N^e$ is a non-linear part of the unit stiffness matrix; $F^e$ is a unit load array; $U^{e''}$ is a unit acceleration array; $U^{e'}$ is a unit speed array; $U^e$ is a unit displacement array; M is an integrated mass matrix; C is an integrated damping matrix; K is an integrated stiffness matrix; F is an integrated load array; U" is an acceleration array of the drill string-drill bit-rock system; U' is a speed array of the drill string-drill bit-rock system; U is a displacement array of the drill string-drill bit-rock system.

5. The dynamic design method for the personalized drill bit for the complex difficult-to-drill formation according to claim 1, wherein the rock drillability indexes in the step S1 include a rock hardness, a strength, a Poisson's ratio, and a ground stress.

* * * * *